United States Patent [19]

Lacombat et al.

[11] 4,371,264
[45] Feb. 1, 1983

[54] OPTICAL SYSTEM FOR ALIGNING TWO PATTERNS AND PHOTO-REPEATER USING SUCH A SYSTEM

[75] Inventors: Michel Lacombat; Georges Dubroeucq, both of Paris, France

[73] Assignee: Thomson-CSF, Paris, France

[21] Appl. No.: 124,077

[22] Filed: Feb. 25, 1980

[30] Foreign Application Priority Data

Feb. 27, 1979 [FR] France .............................. 79 05007

[51] Int. Cl.³ .......................... G01B 11/00; G02B 5/18
[52] U.S. Cl. .............................. 356/356; 250/237 G; 350/162 R; 356/363; 356/400; 356/401
[58] Field of Search ................................ 356/354–356, 356/363, 400–401, 351; 250/237 G, 561, 492 A, 492 B; 350/162 R, 162 ZP

[56] References Cited

U.S. PATENT DOCUMENTS

| | | | |
|---|---|---|---|
| 3,198,061 | 8/1965 | Hock | 356/395 |
| 3,542,469 | 11/1970 | Hennings | 350/81 |
| 3,756,723 | 9/1973 | Hock | 356/351 |
| 4,052,603 | 10/1977 | Karlson | 356/400 |
| 4,103,998 | 8/1978 | Nakazawa et al. | 356/401 |
| 4,113,388 | 9/1978 | Gates et al. | 356/356 |
| 4,153,371 | 5/1979 | Koizumi et al. | 356/401 |
| 4,200,395 | 4/1980 | Smith et al. | 356/400 |
| 4,251,160 | 2/1981 | Bouwhuis et al. | 356/401 |

OTHER PUBLICATIONS

Torii et al., "Theory of Alignment Monitoring By Diffraction from Superimposed Dual Gratings", J. Opt. Soc. Am., vol. 68, 12-1978, pp. 1716-1731.
Torii et al., "Theory of Alignment Monitoring by Diffraction from Superimposed Dual Gratings", J. Opt. Soc. Am., vol. 68, 12-1978, pp. 1716-1731.
Gale, B., "The Theory of Variable Spacing Gratings", Optica Acta, 1966, pp. 41-54.

Primary Examiner—William H. Punter
Attorney, Agent, or Firm—Oblon, Fisher, Spivak, McClelland & Maier

[57] ABSTRACT

An optical system for aligning two patterns particularly by photo-repetition in which a first pattern formed by two optical networks, disposed along two coordinate axes is illuminated by the image of a second pattern comprising two optical networks, forming a reference produced from the orders of diffraction. In a variation, the optical networks are formed from a series of parallel strokes whose thickness and spatial distribution in a first direction parallel to one of the coordinate axes are determined by a pseudo-random code; the strokes of the optical networks of the first pattern being furthermore interrupted periodically in a second direction orthogonal to the first direction so as to form an optical network with a constant pitch in this direction. The optical alignment system comprises means for detecting the intensity of a predetermined part of the orders of diffraction in the second direction.

20 Claims, 22 Drawing Figures

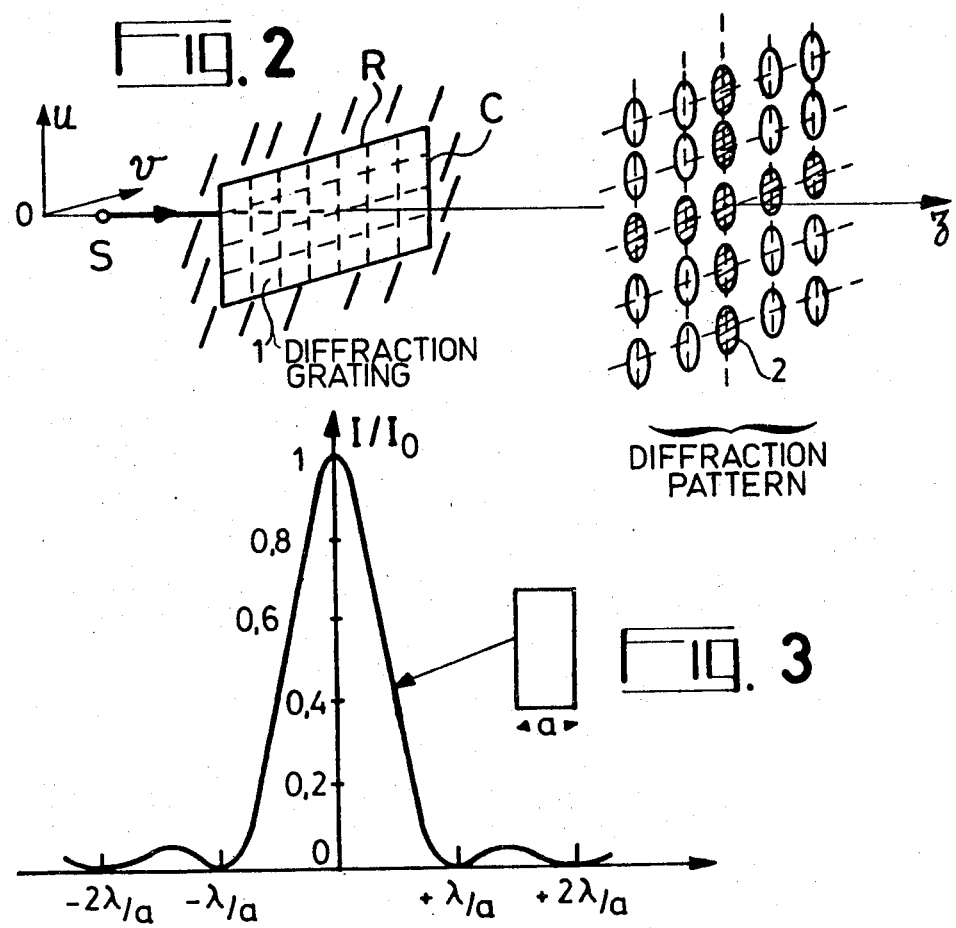
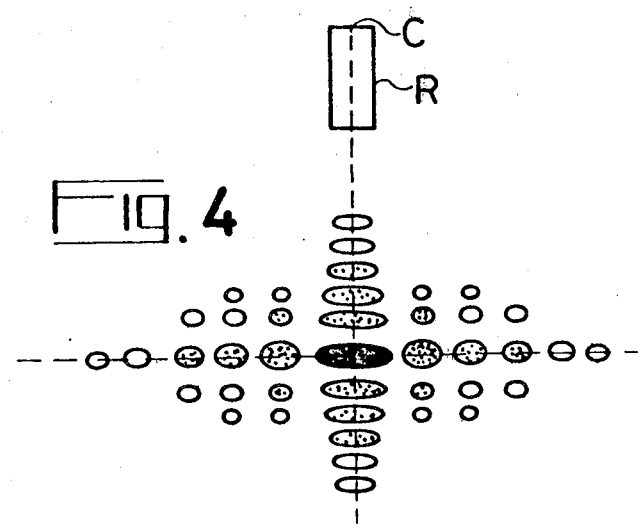

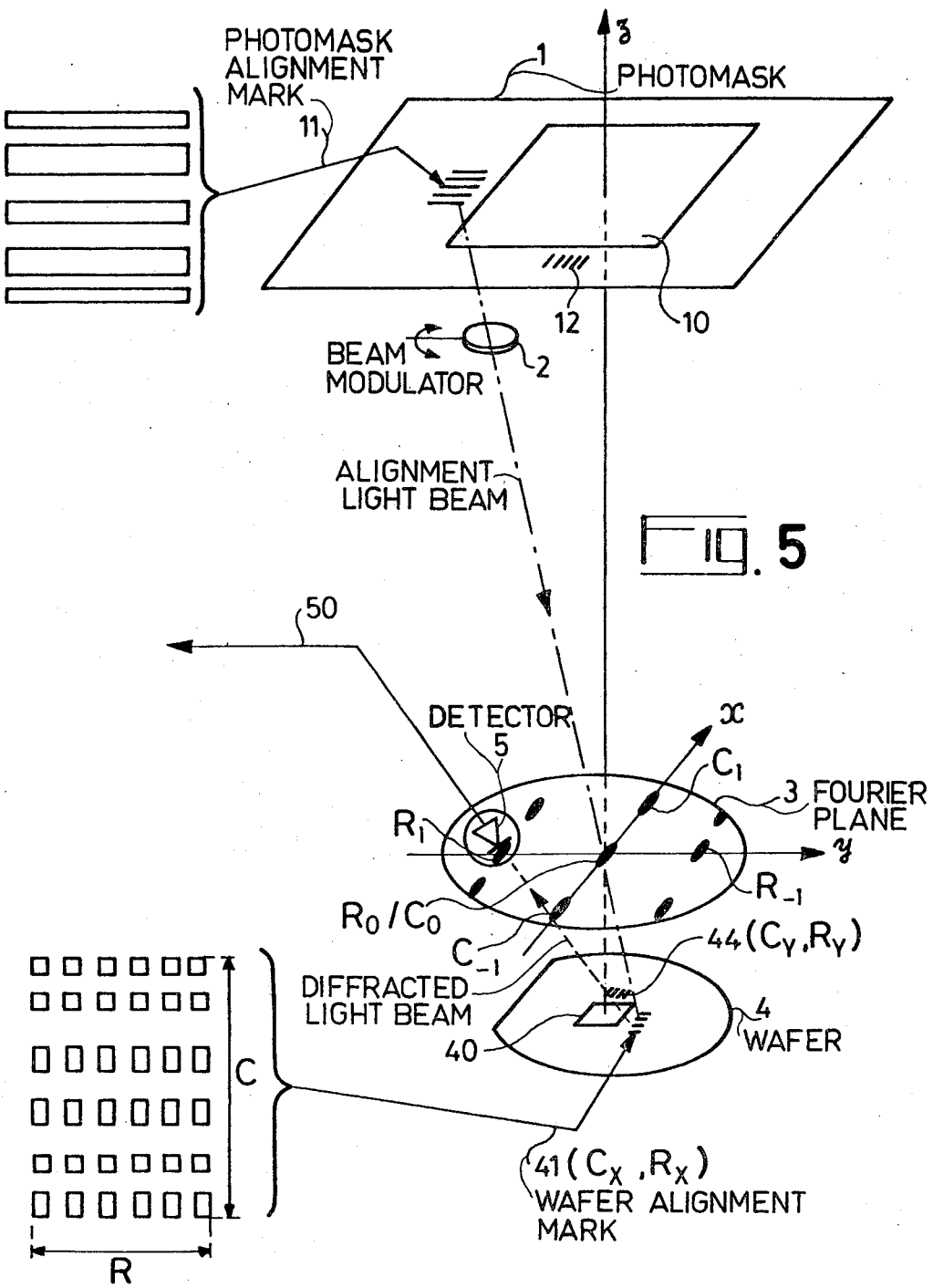

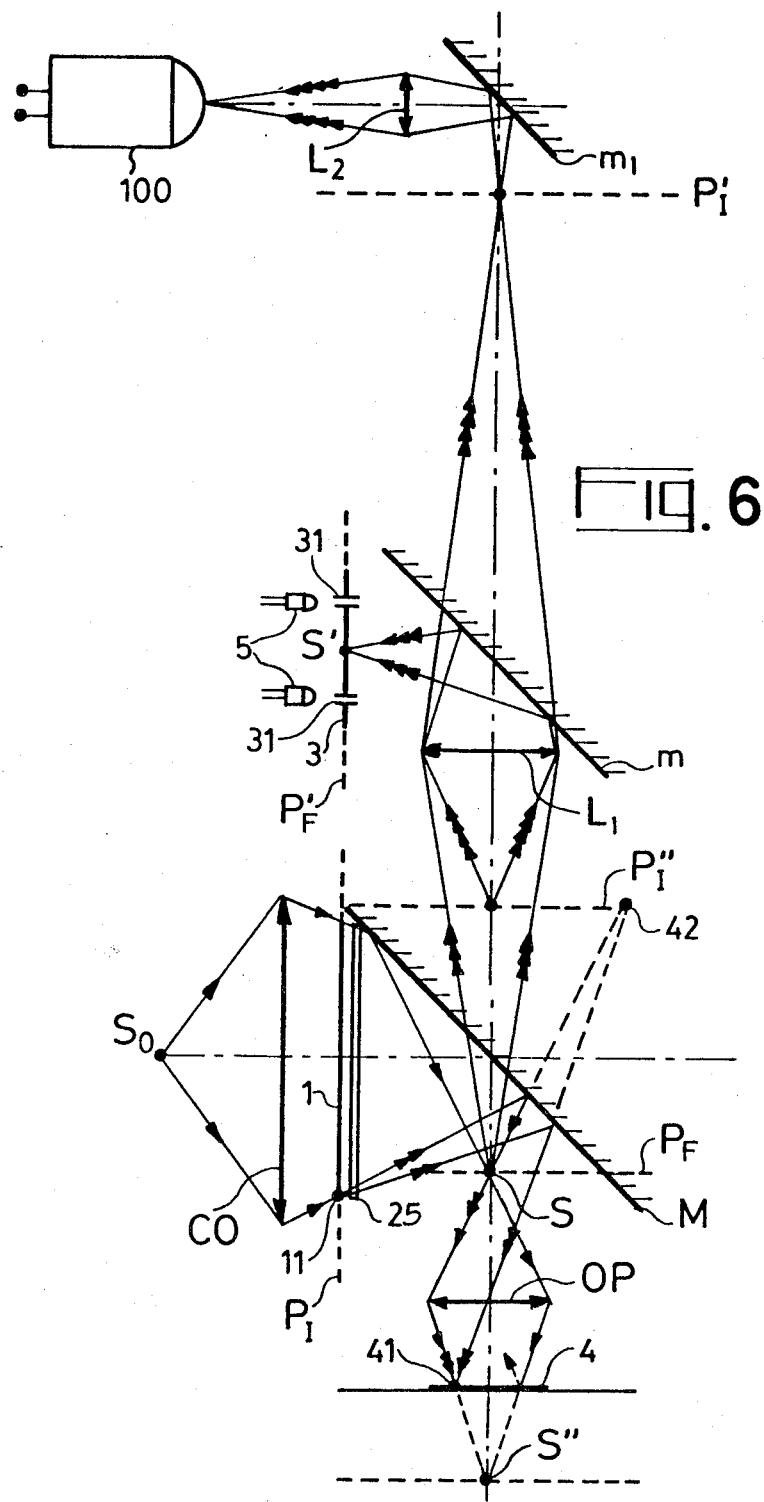

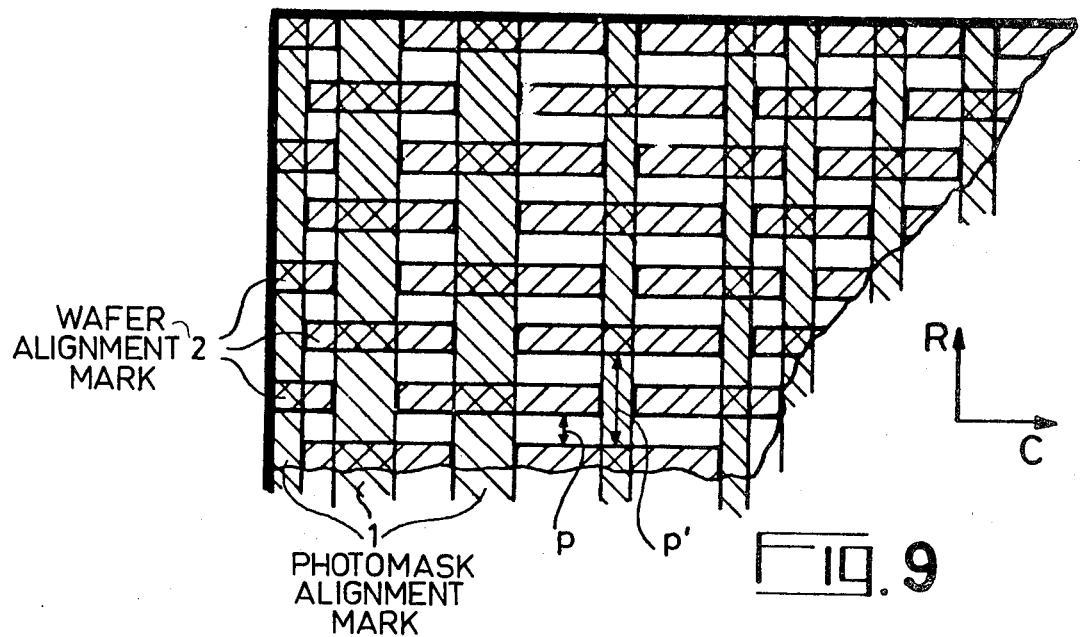
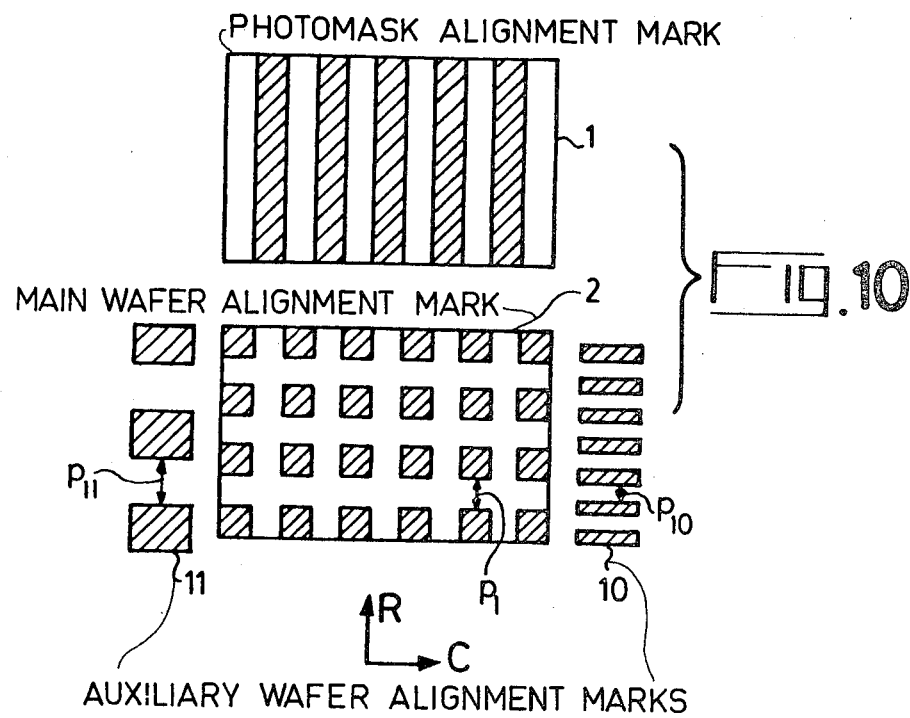

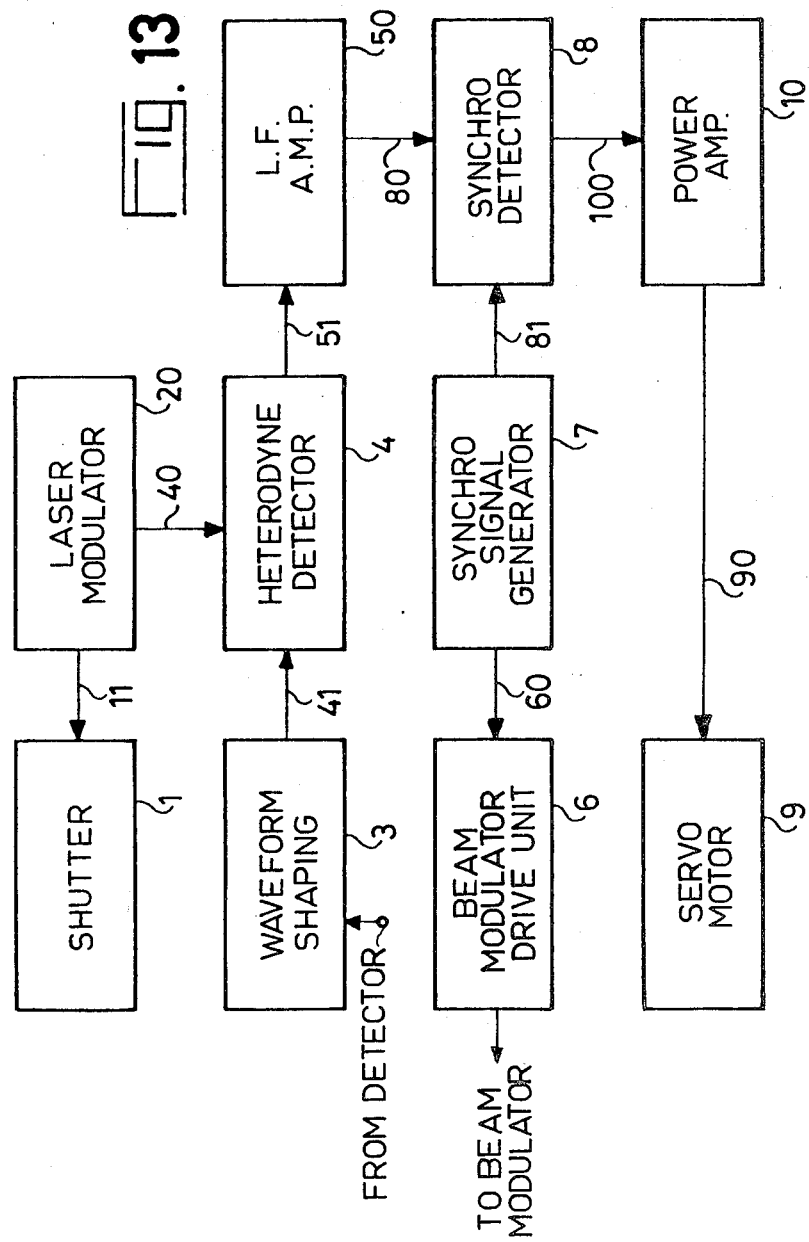

OPTICAL SYSTEM FOR ALIGNING TWO PATTERNS AND PHOTO-REPEATER USING SUCH A SYSTEM

FIELD OF THE INVENTION

The invention relates to an optical system for aligning two patterns and in particular a photo-repeater using this optical alignment system for positioning semiconductor wafers along two axes of reference.

BACKGROUND OF THE INVENTION

The manufacture of integrated circuits involves forming windows on the substrate for locating the positions of elements or for treatment. This substrate is coated with a layer of photosensitive resin. The windows are formed by masking this resin with a mask. Previously, direct contact or proximity was used as transfer method. Present processes use the technique of transfer by optical projection.

This projection may be effected with a 1/1 ratio and the mask is projected as a whole onto the wafer. This projection may also be effected by dividing the image either through analysis of the mask by means of a mobile slit, or by using the 1/n ratio photo-repetition technique.

In the technique of circuit manufacture by direct photo-repetition, each pattern is projected directly onto the semiconductor wafer previously coated with a layer of photosensitive resin, in accordance with a preestablished programme, the position of the wafer being controlled by interferometry in each direction. Conventionally, photo-repetition is carried out by shifting the wafer in the two orthogonal directions x and y. During the first exposure of the wafer, there are no particular difficulties for positioning, only that the successively exposed zones must be parallel to the plane of the pattern to be projected. During subsequent exposures, on the contrary, it is absolutely necessary for the projected patterns to be centered and aligned in relation to the previously projected patterns, for all zones of the wafer.

In fact, during projection of another pattern for providing another integration level of this circuit, the wafer must be placed in the same position as during the first exposure, so that there is correct superimposition of the different patterns. For this, it is necessary to center the wafer and to cause it to undergo a rotation which brings it into its first position. Thus, if the second pattern to be projected is exactly positioned in relation to the previously projected pattern, there will be coincidence.

In the case of an overall transfer, the alignment required for proper superimposition of the images is achieved as a whole by using two reference marks on each image plane, diametrically opposite each other for maximum accuracy. In the case of direct photo-repetitions, overall alignment is required for defining the angular position of the wafer and this alignment may be sufficient if the distribution of the future semiconductor chips on the wafer corresponds to a known linear law. However, if maximum accuracy is desired, periodic realignment, even chip by chip, may be necessary.

The invention may be applied to all the cases of transfer by projection: overall, by scanning or photo-repetition. However it is in this last case that it presents most interest.

In the prior art, the most widespread method consists in superimposing reference patterns plotted on the mask and on the semiconductor wafer by means of optical transfer means and in observing this superimposition with a two-lens microscope of the so-called "Split Field" type. The eye of the operator may be advantageously replaced by a vidicon tube for display on a television screen.

According to a more sophisticated technique, the video signal obtained by the television camera may be processed to obtain an analog or digital signal, usable by servo-control circuits. Some processes use for example St. Andrew's cross scanning and its complement for determining the deviation at alignment which results in an interval between the leading edges of the signals.

The devices using the processes of the prior art have two major disadvantages:

the field of the reference patterns plotted on the mask and the semiconductor wafer is completely illuminated and, on the images of these references is superimposed a not inconsiderable noise level (parasite reflection, diffusion, diffraction) which leads to a poor signal/noise ratio;

the contrast of the silicon reference marks is very variable from one integration level to the other, taking into account the variations in oxide thickness or the nature of the deposits (polycrystalline silicon, aluminium). The quality of the alignment will then be essentially variable. It depends either on the keenness of sight of the operator, or on the power of resolution of the associated electronic means.

SUMMARY OF THE INVENTION

To palliate these disadvantages, the invention provides an optical system for aligning at least a first pattern, carried by a first medium in relation to a second pattern, carried by a second medium, forming a fixed reference; this optical alignment system being characterized in that the first and second patterns each comprise at least one principal optical network formed by a succession of parallel strokes whose width and spatial distribution in a first direction (C) are determined by a particular distribution code; the strokes of the first pattern being moreover periodically interrupted in a second direction (R) to form an optical network having a constant pitch in this direction and in that there are provided:

a monochromatic light source combined with optical means for illuminating the first pattern by projection onto this pattern of the image of the second pattern with a predetermined magnification and for producing orders of diffraction in the first and second directions (C, R);

and means for detecting the intensity of a predetermined part of the diffraction orders in the second direction, the detected intensity passing through a maximum and the accurate alignment being obtained when the spatial correlation of the first pattern and of the projection of the image of the second pattern on the first pattern is maximum.

The invention also provides a photo-repeater comprising an optical alignment system for aligning a semiconductor wafer, having on its upper face a layer of photosensitive resin and on which the first pattern is inscribed, in relation to a grating on which the second pattern is inscribed, as well as other patterns to be projected on the wafer; this photo-repeater being characterized in that it comprises a projection lens used alternately for projecting the image of the second pattern on the first pattern during alignment phases and for projecting on the wafer at specific positions of the image, other patterns during exposure phase.

The above and other objects, features and advantages of the present invention will become apparent from the following description, given solely by way of non-limiting illustration, when taken in conjunction with the accompanying drawings.

DESCRIPTION OF THE DRAWINGS

FIGS. 2 to 4 illustrate the physical phenomenon used by the invention.

FIG. 5 is a simplified diagram of an optical alignment system according to a first approach of the invention.

FIG. 6 is a detailed optical diagram of a photo-repeater using the optical alignment system in accordance with the first approach.

FIGS. 7 to 12 refer to variations of the optical network used in the alignment systems of the invention.

FIGS. 13 and 14 illustrate an example of a servo-control electronic circuit associated with the alignment systems of the invention.

DESCRIPTION OF THE PREFERRED EMBODIMENTS

In what follows the invention will be illustrated, without imposing any limitation thereon, by an optical alignment system used in an apparatus for transferring by direct photo-repetition on silicon. This apparatus will be called more briefly photo-repeater.

Figure 1:
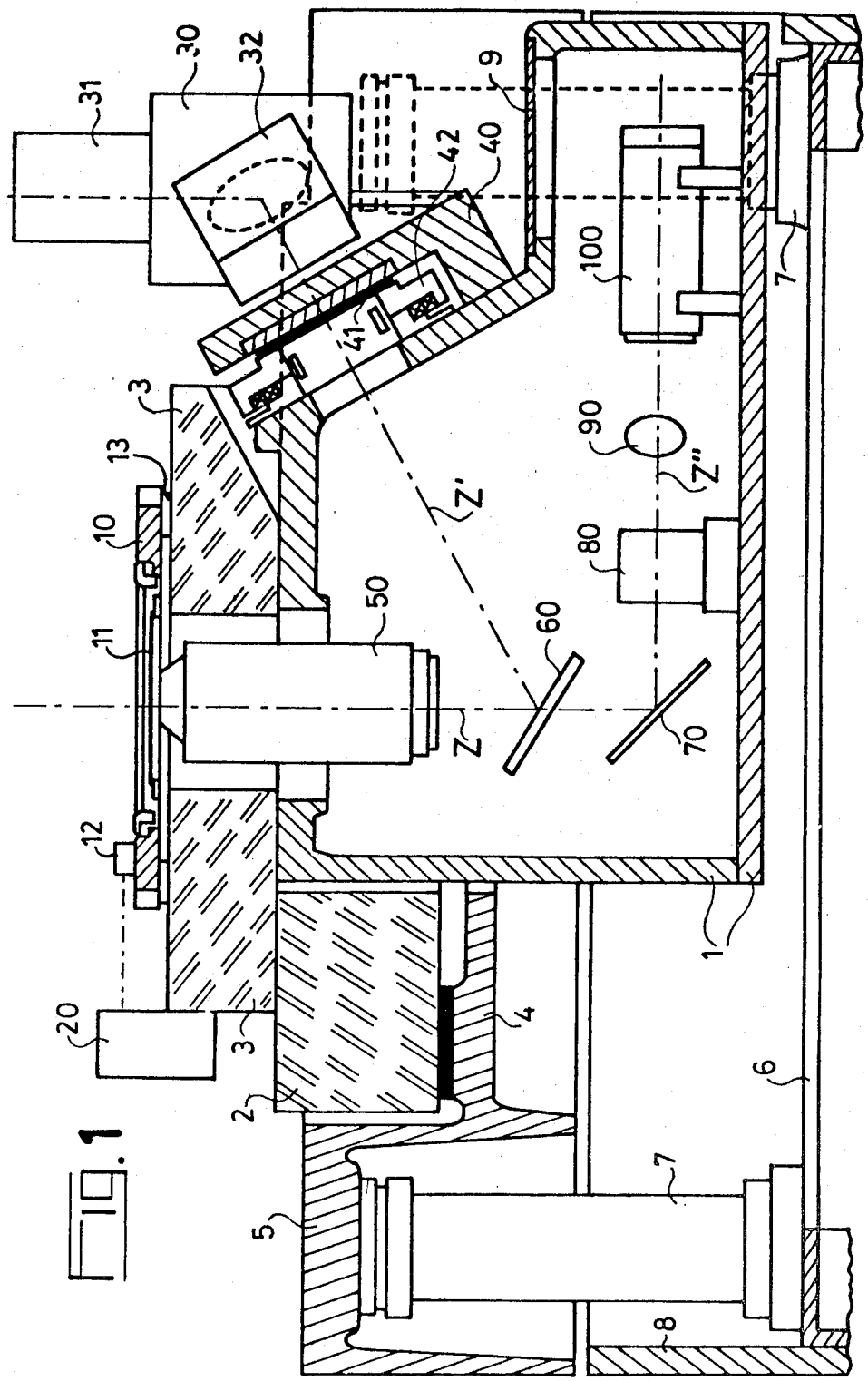
FIG. 1 is an example of a photo-repeater in which the optical alignment system of the invention may be used.

An example of a photo-repeater is shown in FIG. 1. It comprises a lower frame 8 and an upper frame 5. The upper frame rests on a plate 6, integral with the lower frame 8, via air damper columns 7. Upper frame 5 supports, via a damping block 4, a carrier bed 2. This carrier bed 200 forms the base of a reference bed 3. This bed 3 supports a X-Y movement frame, not shown in detail, and a corrector plate 10, capable of moving along two orthogonal axes X and Y. The amplitude of these movements is of the order of ten microns or so in relation to frame X-Y whose travel is of the order of 150 mm. These relative movements are controlled by two groups of piezoelectric ceramics acting respectively along axes X and Y. The movements are effected either under the control of two crossed-movement interferometry units, or under the control of alignment detectors. Only interferometer 20 and mirror 12 for measuring along axis X have been shown. This process is known in the art, the the control circuits have not been shown in the diagram of FIG. 1. An optical unit 1 is integral with reference bed 3. It will be described more fully for it comprises the optical alignment system forming the subject matter of the present invention. The different components of this optical unit 1 are in particular a projection lens 50 and a grating-holder base 44. Grating-holder base 44 is a grating changeover switch on which several gratings 41 may be fixed. The gratings are pre-aligned on the machine by means of a plate 40, movable along two axes X and Y and rotatable in the plane defined by X and Y. The semiconductor wafer to be exposed 11, coated with a layer of photosensitive resin, is placed on corrector plate 10. This corrector plate may slide in the plane of the reference bed on air cushions 13. The projection lens 50 may move along axis Z. It is provided with all the usual adjustment members (which are not shown in FIG. 1). On this grating are inscribed the patterns of the circuit to be projected onto the silicon wafer 11, the reference mark pattern forming the subject matter of the invention as well as patterns for pre-aligning the grating in relation to the machine. Optical unit 1 also comprises a semi-transparent mirror 60, a second mirror 70 and an optical trimming means 80, alignment detector means 90 and a vidicon tube 100. The function of these different components will be described further on. The optical unit also comprises an axis window 9 and an illumination unit 30, comprising a condenser and a mirror 32 as well as a light energy source 31.

The physical phenomenon used in the invention will first of all be described with reference to FIGS. 2 to 4. In what follows, use will be made of optical networks. An optical network is a transparent or reflecting surface on which a periodic disturbance of transparency or reflection is provided, with a very close pitch and comprising a large number of pitches. The networks used in the invention are provided with disturbances along two directions orthogonal to each other (u, v). If this network is illuminated by a beam coming from an infinitely remote pinpoint source or from a source placed at the focal point of a collimating lens, the light is transmitted not only in the regular transmission or reflection direction, but also in a number of well-defined directions which are interference maxima. The positions of these maxima depend on the wavelength. These maxima are observed in a plane situated at infinity. One means of observing these maxima at a finite distance is to place a lens after the optical network. Orders of diffraction corresponding to the maxima can be observed in the focal plane of this lens. This plane is further called Fourier plane. Since the network is in two dimensions, orders of diffraction distributed along two privileged axes parallel to axes u and v can be observed. This has been shown symbolically in FIG. 2 by spots 2. The dimensions of these spots 2 are inversely proportional to the dimensions (R, C) of the optical network 1. In the vicinity of the interference maxima, the function describing the light intensity is no other but the diffraction function of a uniformly transparent pupil having the same dimension as the optical network. This function is shown in FIG. 3. The intensity passes through a zero minimum for values $\lambda/a$, a being equal to the lengths R or C (along axes v or u). The trend of the diffraction spots is given by FIG. 4. If in one direction the optical network comprises unevenly distributed disturbances, we find in this direction diffraction lines whose distribution depends on the particular arrangement of the disturbances of the network. This is particularly the case if the width and the spatial distribution of the disturbances are determined by a non-uniform distribution code. This code may be a pseudo-random code, of the Barker code type. One example of this code will be described further on.

The alignment in accordance with the invention, using the physical phenomena which have just been described, is shown schematically in FIG. 5. A silicon wafer 4 onto which are to be projected patterns 10 carried on a grating 1 must be aligned with respect to these patterns. For this, grating 1 and wafer 4 carry patterns 11 and 12, and 41 and 42 respectively, which will serve for aligning the wafer in relation to grating 1. Grating 1 and wafer 4 are situated in planes perpendicular to the optical axis Z of a projection lens 3. The patterns serving for the alignment are optical networks formed by strokes parallel to two preferential axes X and Y orthogonal to each other. Networks 11 and 12 are networks coded in one direction. Networks 41 and 42 are also coded in direction C (respectively $C_X$ and $C_Y$), with the same code as networks 11 and 12. Furthermore, the strokes forming this code are regularly interrupted in direction R (respectively $R_X$ and $R_Y$), and therefore form a network having an even pitch in this direction. In FIG. 5, only the alignment of networks 11 and 41 has been shown, i.e. the alignment along axis X. The alignment along axis Y is identical.

The image of network 11 will be projected onto network 41, by means of appropriate optical means not shown. The dimension of network 11 is such that it may be superimposed on network 41 in direction C, taking into account the magnification of the optical means. As has been pointed out above, network 41, illuminated by the image of network 11, will produce orders of diffraction in two privileged directions, i.e. along directions C and R (respectively $C_X$, $R_X$ and $C_Y$, $R_Y$) or, what amounts to the same thing, along directions X and Y. There are shown in Fourier plane 3, the orders of diffraction $C_0$, $C_1$, $C_{-1}$ and in the other direction $R_0$, $R_1$, $R_{-1}$. The order of diffraction $R_1$ is detected by an optoelectronic means 5. The output signals 50 are transmitted to appropriate electronic means, not shown. The order $R_{-1}$ may also be detected and the sum of the signals representing the intensity of these two orders ($R_1$, $R_{-1}$) may be found. Network 42 for aligning path Y will diffract in directions orthogonal to the directions of diffraction of network 41. Orders $R_1$ and $R_{-1}$ of network 42 may be detected on axis X. This technique enables the signals for alignment X and for alignment Y to be discriminated spatially, if the pitches of the networks in directions R and C are distinct. If not filtering may, for example, be achieved by using two orthogonal polarizations of the light for networks X and Y. The detectors are then equipped with analyzers for selecting solely the light corresponding to the observed direction.

The use of a two-dimensional network is one of the fundamental characteristics of the invention and avoids two disadvantages:

the networks of the grating themselves produce orders of diffraction when they are illuminated. The use of orders of diffraction in direction C would lead to risks of disturbances due to parasite reflections and diffusions;

if orders of diffraction are used in direction C, additional optical elements would have to be introduced in the path of the alignment rays (for example semi-reflecting mirrors) which would disturb the projection of the image of the networks of the grating projected onto the networks of the semiconductor wafer.

Figure 7:
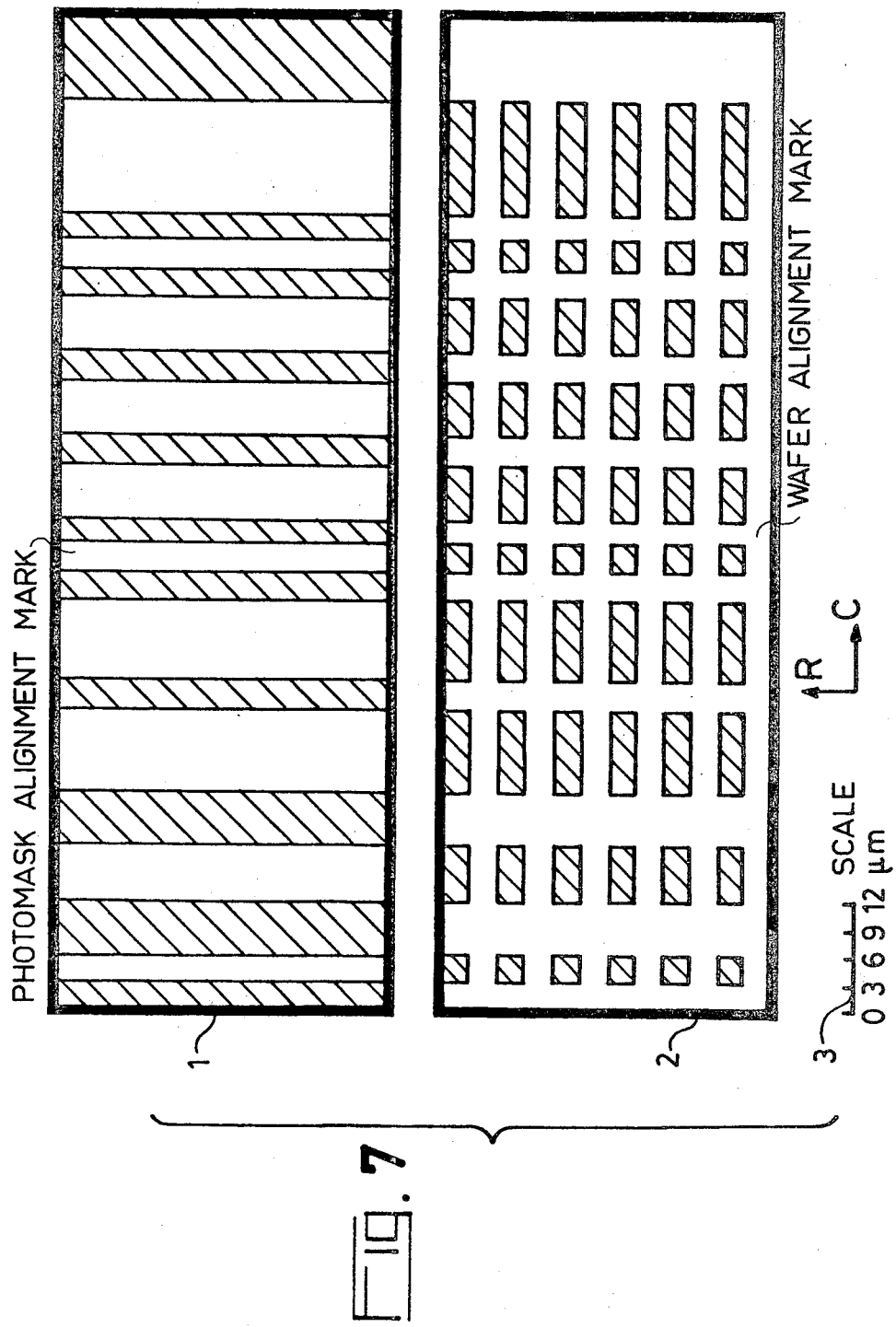
Figure 8:
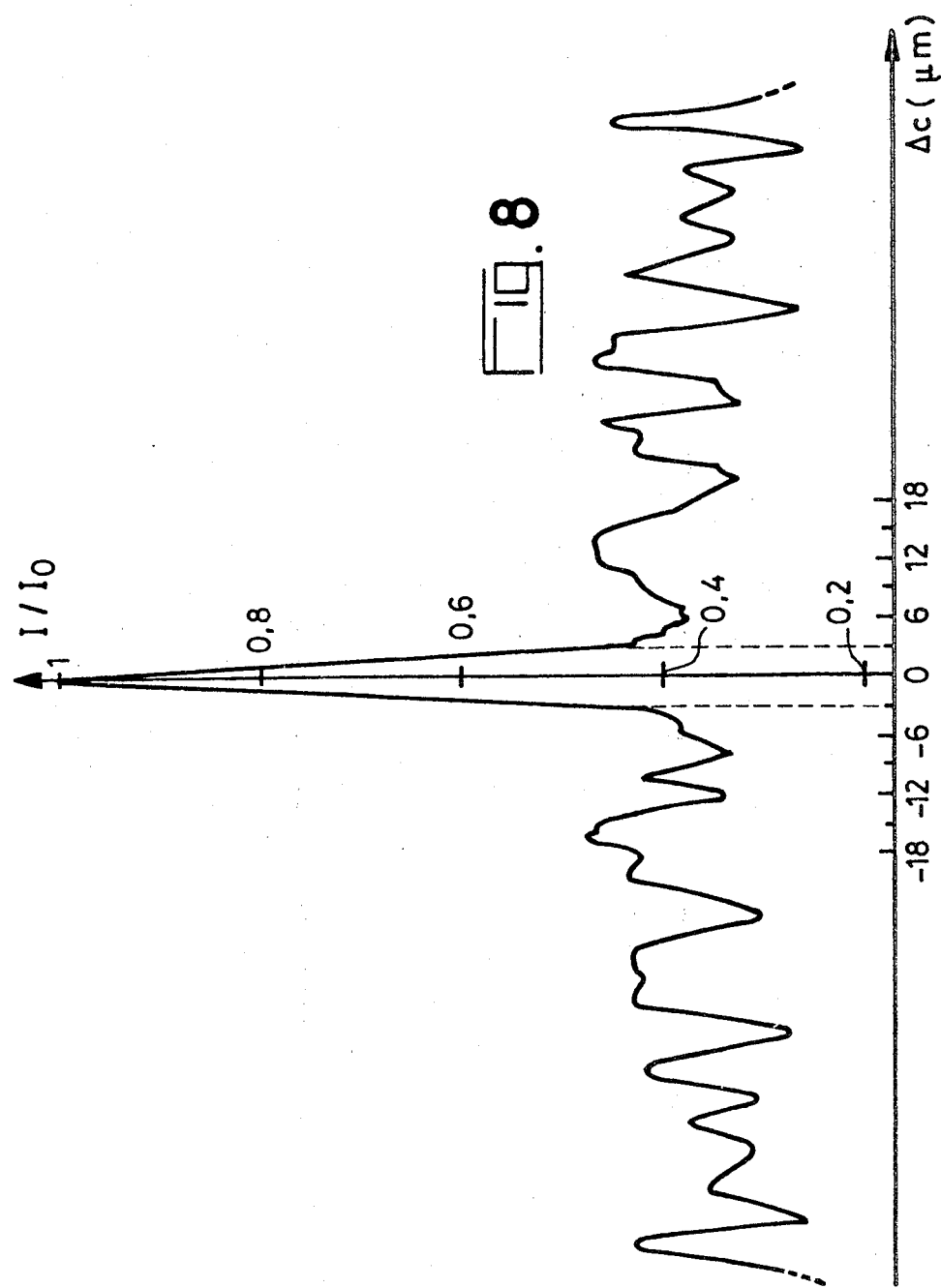

FIG. 7 illustrates one example of a usable code. The code 11 (or 12) of FIG. 5 inscribed on the grating at 1, and the code 41 (or 42) inscribed on the semiconductor wafer at 2. At 3 is shown the scale. In direction R the pitch is constant, of 3 μm; in direction C the pitch is variable. The superimposition of these two codes, i.e. the superimposition of the image of code 1 on code 2, results in the detected intensity in orders $R_1$ and $R_{-1}$ being maximum. FIG. 8 is a normalized response curve for the intensity detected by detection means 5. This curve has been obtained by experimentation. A very selective correlation peak can be observed and, out of coincidence, i.e. outside the alignment when the projection of the image of code 1 on code 2 does not give the exact juxtaposition on one side or on the other, in direction C, the average response is established at about 40% of the maximum, for this particular code.

Other structures may be used, by way of example of variations, a grating network 1 may be imagined, identical to network 1 of FIG. 7 and an imbricated network for wafer 2, as shown in FIG. 9. In direction R, diffraction orders appear at different positions according as to whether alignment is achieved or not. Network 2 behaves like the superimposition of two even-pitch imbricated networks: one of the pitches being p and the other p′.

Although this type of coded network presents a predominant correlation peak, the average signal level out of alignment varies, according to the code chosen, between 25% and 50%. Furthermore, in direction C, the network may be assimilated to a sum of constant-pitch networks all different from each other. It follows that diffracted orders can be observed in this direction corresponding to each of these pitches which may upset the detection of the R orders of the network in the other alignment direction.

Figure 11:
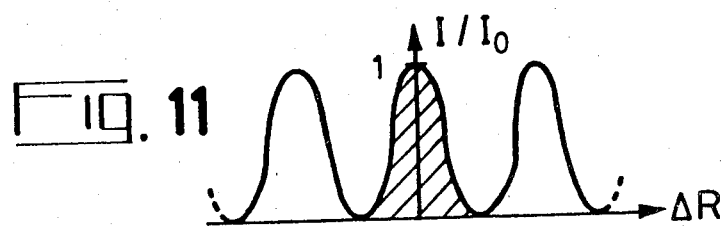
Figure 12:
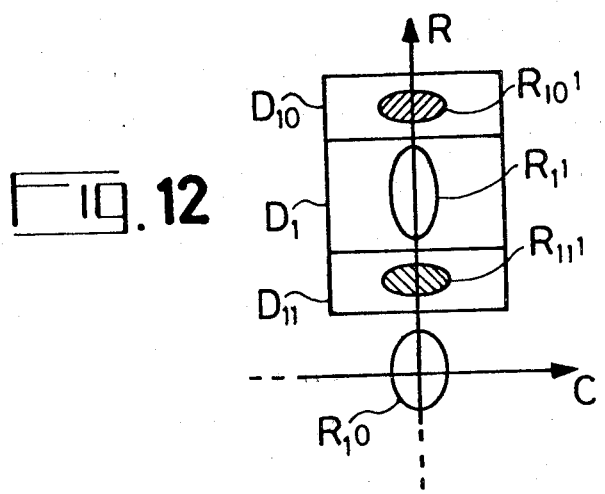

To palliate these difficulties, a network (R-C) may be chosen having a constant pitch in these two directions. However if network 2 with constant pitch $p_1$ of FIG. 10 is illuminated by the image of a constant pitch network 1, inscribed on grating 2, the response curve at alignment and out of alignment is given by FIG. 11. A succession of maxima can be seen due to the periodicity of the network. To lift the indetermination, two auxiliary networks 10 and 11 (also having a constant pitch, but different one from the other: $p_{10}$ and $p_{11}$ and different from the pitch $p_1$ of the principal network 2) on each side of network 2, in direction C. Out of alignment, one of these networks will also diffract in direction R, according as to whether the image of code 1 is projected onto network 2 too much to the right or too much to the left, in direction C. This result is illustrated in FIG. 12. In addition to the orders of principal network $R_1 0$ and $R_1 1$, the orders of networks 10 and 11 can be found: $R_{11} 1$, and $R_{10} 1$. These latter two orders being exclusive one of the other. If three detectors $D_1$, $D_{10}$ and $D_{11}$ are placed in direction R, the alignment takes place in two phases: during the first phase or course alignment, one of the two orders $R_{10} 1$ or $R_{11} 1$ is detected, thus the direction of non-alignment is determined and the members controlling the movement of the wafer are actuated; during the second phase of fine alignment only the intensity of the order $R_1 1$ of the principal network is measured. Movement then takes place on the hatched central part of FIG. 11. As previously, orders $R_{-1}$ may also be detected. The advantage of this method lies in better dynamics of the response: in fact, the curve of FIG. 11 passes theoretically through zero out of alignment, i.e. when the background noise is very low.

Other variations may be imagined: in particular the etched silica which is to form the network may have edges with rounded features which will diffract along an annulus whose radius depends on the pitch of the network. Positions may then be used at different points of the annulus, not disturbed by the parasite reflections, for detecting the correlation signal.

The main advantage of all these processes, which do not involve visual keenness, is to offer a signal independent, in the first order, of the contrast of the image on the wafer. Reference marks may then be used inscribed at the first level of integration, for the whole succession of following levels.

FIG. 6 is a detailed optical diagram of a photo-repeater using the alignment system according to a first approach of the invention. A light energy source $S_0$ illuminates the grating 1 through condenser C0, a semi-reflecting mirror M gives, of this source $S_0$, an image S. This image S is taken up by the optical projection means OP which gives an image S'' thereof. The semiconductor wafer to be exposed is placed at 4. A pattern 11 of the grating is imaged at 41 by mirror M and optical projection means OP; this pattern 11 may be one of the networks which has just been described. Its image will illuminate a network 41, which produces orders of diffraction in the Fourier plane $P_F$, this plane merges with S. It is more practical to observe the orders of diffraction not in plane $P_F$, but in an image plane of this plane $P_F$: $P'_F$, given by an auxiliary optical means comprising a lens $L_1$ and a second semi-transparent mirror m. In this plane $P'_F$ will be placed an opaque disk comprising two diaphragms 31, behind which opto-electronic detectors 5 are placed. This optical means also enables the superimposition of the image of network 11 and of network 41 to be visualized simultaneously. Mirror M gives of 41 an image 42, in a plane $P''_I$, the image of plane $P_I$ of grating 1. This plane is in its turn imaged at $P'_I$ by means of lens $L_1$, through semi-transparent mirror m. This image plane $P'_I$, by means of a mirror $m_1$ and a lens $L_2$, is projected onto a vidicon tube 100, associated with visualization means not shown. This visualization of the images of reference marks 41 on the vidicon tube serves to help in focusing and in checking the proper operation, but has no part in the alignment.

Although in FIG. 6 only a pair of grating-wafer alignment marks, respectively 11-41, for example for alignment X, has been shown, it is necessary to provide a second pair of marks (not shown) for alignment Y. For the detection a second pair of detectors are positioned orthogonal to detectors 5. If a network such as that of FIG. 10 is used, additional detectors are provided for the additional networks ($R_{10}$, $R_{11}$).

In this first approach, the alignment path is common to a large extent with the projection path. There must then be available, in the first place, two different wavelength sources. In fact source SO illuminating alignment mark 11 must not sensitize the resin of semiconductor wafer 4 for the alignment. An HeNe laser having a wavelength of 6328 Å for the alignment and a mercury lamp, associated with the blind filters, for the the projection. The optical projection means is corrected for a wavelength of 4050 Å (or 4358 Å or 3650 Å according to the selected source). To obtain a clear image of network 11 of wafer 4 (with good magnification), optical trimming means 25 must be introduced in the optical path between the lens and the grating. This may be a parallel transparent plate of good optical quality ($\lambda/10$) or low power optical means. This plate may also be used to modulate the respective position of the grating marks 11 in relation to wafer mark 41, so as to obtain a modulated signal at the output of the detectors. The position XY of this optical means is not critical, only its angular position counts. It is the only member which must be switched between the alignment phases and the projection phases. Its positioning and its withdrawal may be rapid.

The modulation of the detected signal may also be provided by slight modulation of the position XY of the wafer (a few tens of microns).

On the other hand, the laser beam may also be all-or-nothing modulated, at high frequency. The signals detected by the opto-electronic means 5 are used by associated electronic circuits, which enable the alignment procedure to be made entirely automatic.

One example of these electronic circuits is given in FIG. 13. Only the alignment path X has been shown, alignment path Y being identical. The signals collected by the opto-electronic members 5 are transmitted to an amplifying and shaping unit 3. Plate 2 of FIG. 6 is driven by a unit 6 imparting thereto vibration of constant amplitude and a given frequency. The control signals are produced by a modulation signal generator 7 and transmitted over the connection 60. Generator 7 also transmits synchronization signals (by means of connection 81) to a synchronous detector 8. A unit 20 for modulating the intensity of the laser beam transmits control signals (via connection 11) to a rapid shutter 1. Synchronizing signals are also transmitted (over connection 40) to a heterodyne detection unit 4 which receives the output signals from unit 3 (over connection 41). The output signal from this unit 4 is transmitted to a low-frequency amplifier 50 (over connection 51). A synchronous detector 8 receives on the one hand the output signals from low-frequency amplifier 50 (over connection 80) and, on the other hand, the output signals from generator 7 (over connection 81). The output signal from the synchronous detector (over connection 100) is transmitted to a power amplifier 10 which controls (over 90) the drive motor 9 for path X.

Figure 14:
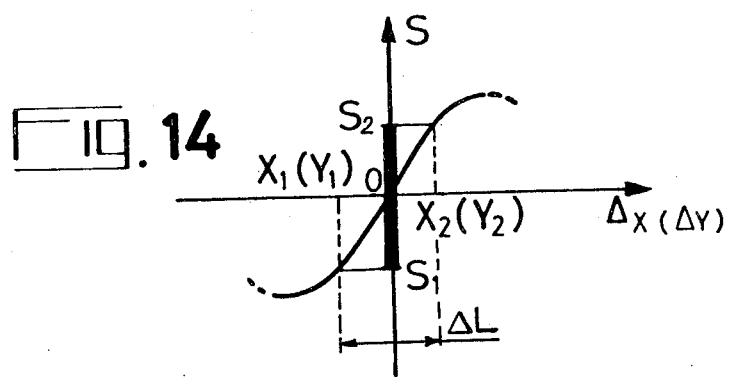

After processing, the signals detected by unit 3 for path X (or for path Y) give servo-control signals whose trend is shown in FIG. 14. These signals may be used for achieving automatic alignment corresponding to a given accuracy. In fact, after an initial overall focusing phase during which the image of networks X and Y of the grating are brought into exact superimposition with the corresponding networks of the wafer, an area may be defined inside which the servo-control signal must remain to satisfy an alignment condition corresponding to an area $\Delta L$, identical for the shift along X and the shift along Y: $\Delta L = X_1 X_2 = Y_1 Y_2$. For this, two thresholds S1 and S2 are defined corresponding to a variation of the alignment $\Delta X = X_1 X_2$ (or $\Delta Y = Y_1 Y_2$). Before any new exposure, one checks to see if signal S is within this area $\Delta X$ ($\Delta Y$) $< \Delta L$. This detection may be carried out by threshold electronic means (not shown) which trigger off or not, depending on the result, local readjustment of the wafer. The result is a gain in time (for realignment is not systematically made) and again in accuracy for adaptation can be made to any particular case. FIG. 13 is only one example among others of a servo-control chain useful within the scope of the invention. These circuits are well-known to the man skilled in the art and will not be further described.

Besides the alignment along two axes of coordinates, respectively X and Y which has just been described, the silicon wafer must, in an initial phase of overall alignment, be positioned angularly ($\theta$). A first alignment procedure X, Y and $\theta$ has been described in French patent application filed on Apr. 20, 1977 by the applicant under the No. 77 11 908 and published under the No. 2 388 371. According to this procedure, two pairs of alignment marks X and Y are also used for the alignment $\theta$.

Figure 15:
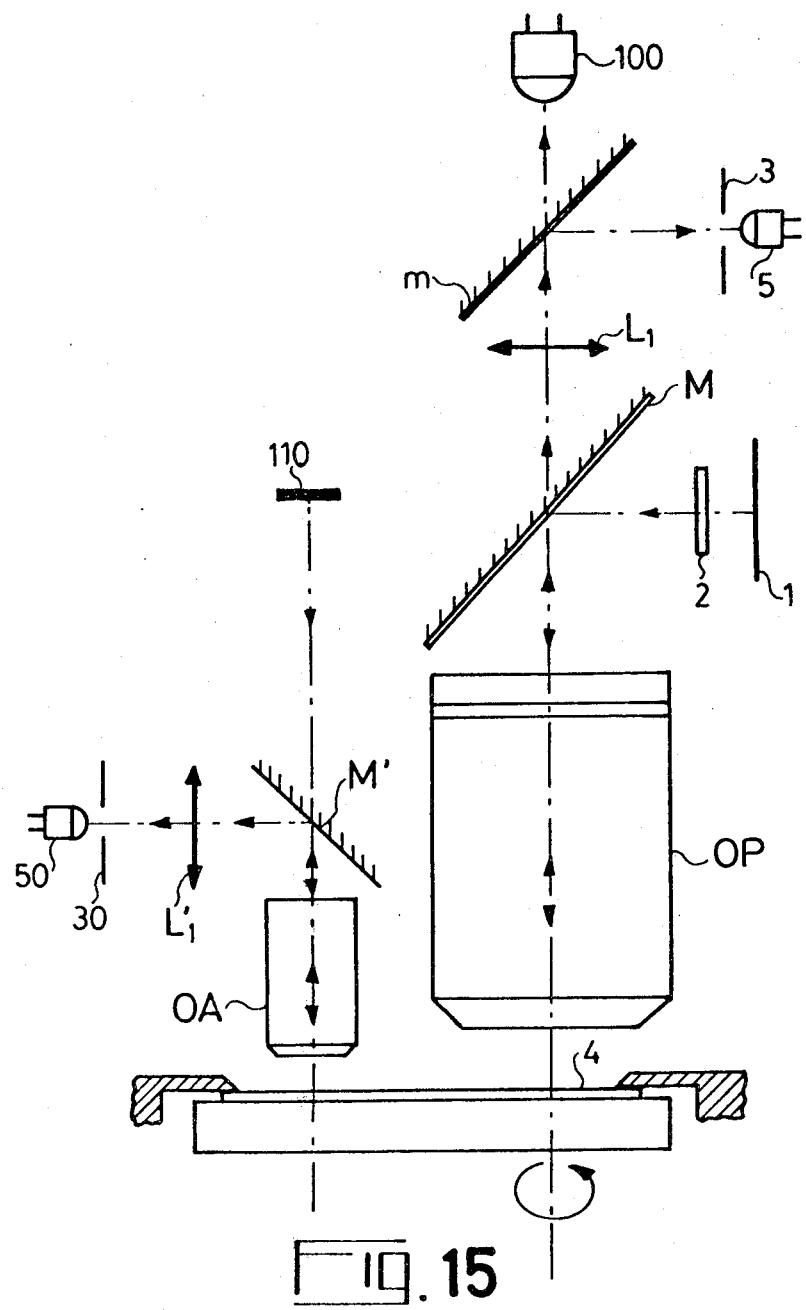
FIG. 15 shows another embodiment of an optical alignment system in accordance with the first approach, using an auxiliary lens for angular alignment.

According to a variation which will be described with reference to FIG. 15, an auxiliary lens OA may also be used for carrying out the angular alignment. We find again in this figure the different members required for the X and Y alignment. The rotational axis of wafer 4 merges with the optical axis of the projection lens used, as previously described, for the X and Y alignment, as well as for the projection properly speaking. For the angular alignment $\theta$ an auxiliary lens OA, an additional reference mark machine 100, an auxiliary optical means comprising a semi-transparent mirror M' and a lens $L'_1$, as well as a detection unit 30-50 are used. The origin of the photo-repetition is established from the projection lens OP which provides the maximum of accuracy and rapidity. Subsequent corrections on the alignment are carried out automatically in accordance with the previously described principles by acting solely on X and Y.

By way of non-limiting example, the following parts may be used for constructing an alignment system in accordance with the invention:

| | |
|---|---|
| projection lens | make CERCO, reference 744, reduction ratio 1/5 |
| alignment illumination source | HeNe laser, $\lambda = 6328$ A |
| illumination source for projection | mercury lamp with extended spectrum, associated with filters for selecting the line $\lambda = 4050$ A |
| opto-electronic detection means | photodiodes: make EGG, type SGD 100 or HAD 1000A or photomultiplier make R.T.C., type XP 1117 (miniphotomultiplier) |
| semi-transparent mirror M | multidielectric mirror coefficient of reflection 0.99 in the range: $4050$ A $< \lambda < 4350$ A coefficient of transmission of about 0.5 for $\lambda = 6328$ A |

The other components (lenses, microscopes, etc.) are chosen from those usually used for photo-repeaters of the prior art.

In the approach which has just been described, no precise mechanical switching is used, i.e. switching of elements required for the alignment and troublesome for projection. Only the optical trimming means of FIG. 6 must be switched. This switching may take place during the movements of table XY and so does not extend the time for transferring onto the semi-conductor wafer.

However, it may be interesting to dissociate completely the projection path from the alignment path. A photo-repeater, constructed according to this second approach, will be described with reference to FIGS. 16 to 19. In this approach, the grating 1 and semi-conductor wafer 4 are indexed in relation to known marks, connected to the photo-repeater.

Figure 16:
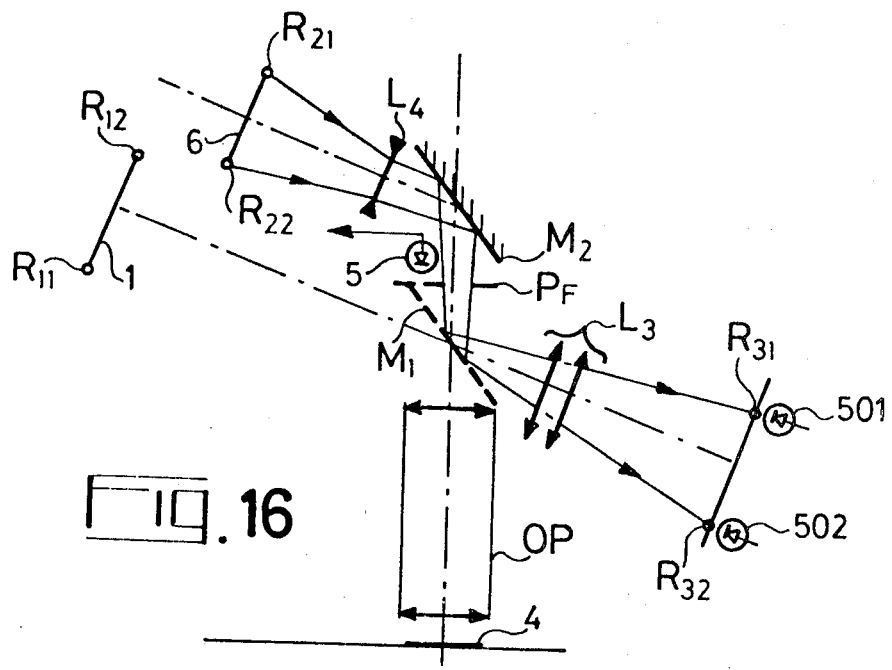
FIGS. 16 to 19 illustrate a second approach to the optical alignment system of the invention.

FIG. 16 describes the first phase of the alignment. Alignment marks $R_{21}$ and $R_{22}$, respectively for the alignment along X and Y, are aligned in relation to reference marks $R_{31}$ and $R_{32}$, fixed in the machine. The images of marks $R_{21}$ and $R_{22}$, situated in plane 6, are projected respectively on marks $R_{31}$ and $R_{32}$ by means of lenses $L_4$ and $L_3$ and mirrors $M_2$ and $M_1$. The alignment is detected by using opto-electronic means 501 and 502. These means are provided with a collimating optical means concentrating the light collected on $R_{31}$ and $R_{32}$. At alignment, the output signal of these two detectors will be maximum. This phase is a checking of pre-adjustment phase, which is only effected periodically (for example once per day).

Figure 17:
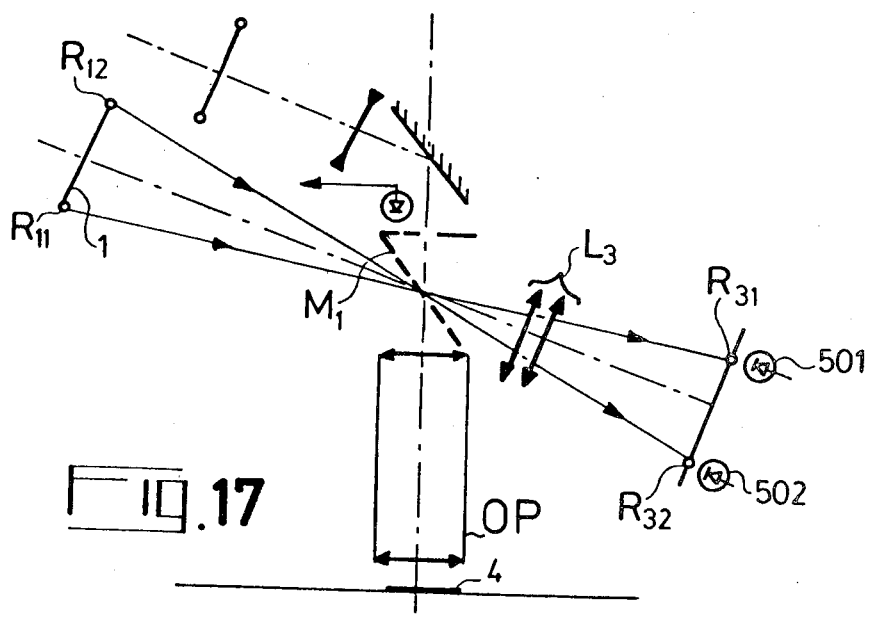

FIG. 17 illustrates the second phase of the alignment. This second phase corresponds to the positioning of grating 1 and its alignment in relation to the same marks $R_{31}$ and $R_{32}$. For this, the grating carries two marks $R_{12}$ and $R_{11}$. This phase only takes place at the beginning of the photo-repetition work and is only carried out when the grating is changed.

Figure 18:
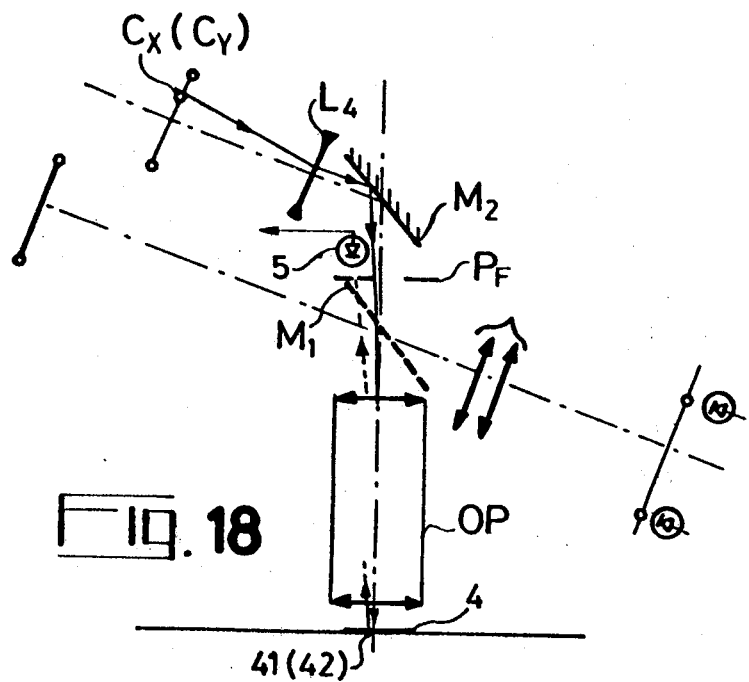

FIG. 18 illustrates the third and last phase of the alignment. During this phase, which should be the most rapid and the most frequent, the silicon wafer 4 is aligned with respect to marks $C_X$ and $C_Y$, which may be the marks $R_{21}$ and $R_{22}$. These marks may be permanently illuminated and the detection is instantaneous. The images of marks $R_{21}$ and $R_{22}$ are projected onto the marks etched in the silicon wafer 4: 41 or 42 by means of lens $L_4$, projection lens OP and mirrors $M_2$ and $M_1$. Marks 41 and 42, illuminated by the images of $R_{21}$ and $R_{22}$, will diffract orders of diffraction, among others, in the directions R which will be detected in the Fourier plane $P_F$ by means of opto-electronic means 5 according to the principles which were outlined in relation to the first approach.

Figure 19:
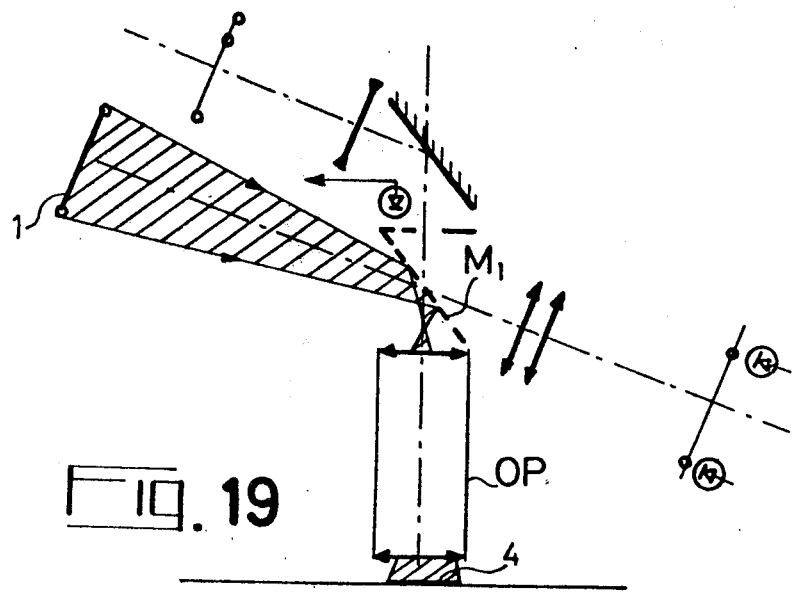

FIG. 19 illustrates the subsequent phase during which wafer 4 is exposed, i.e. during the transfer.

In the approach which has just been described, the alignment path and the projection path are entirely separate. No switching is therefore required. The optical trimming (not shown) provided by plate 2 in FIG. 6 may be effected outside the path of the projection beam.

Figure 20:
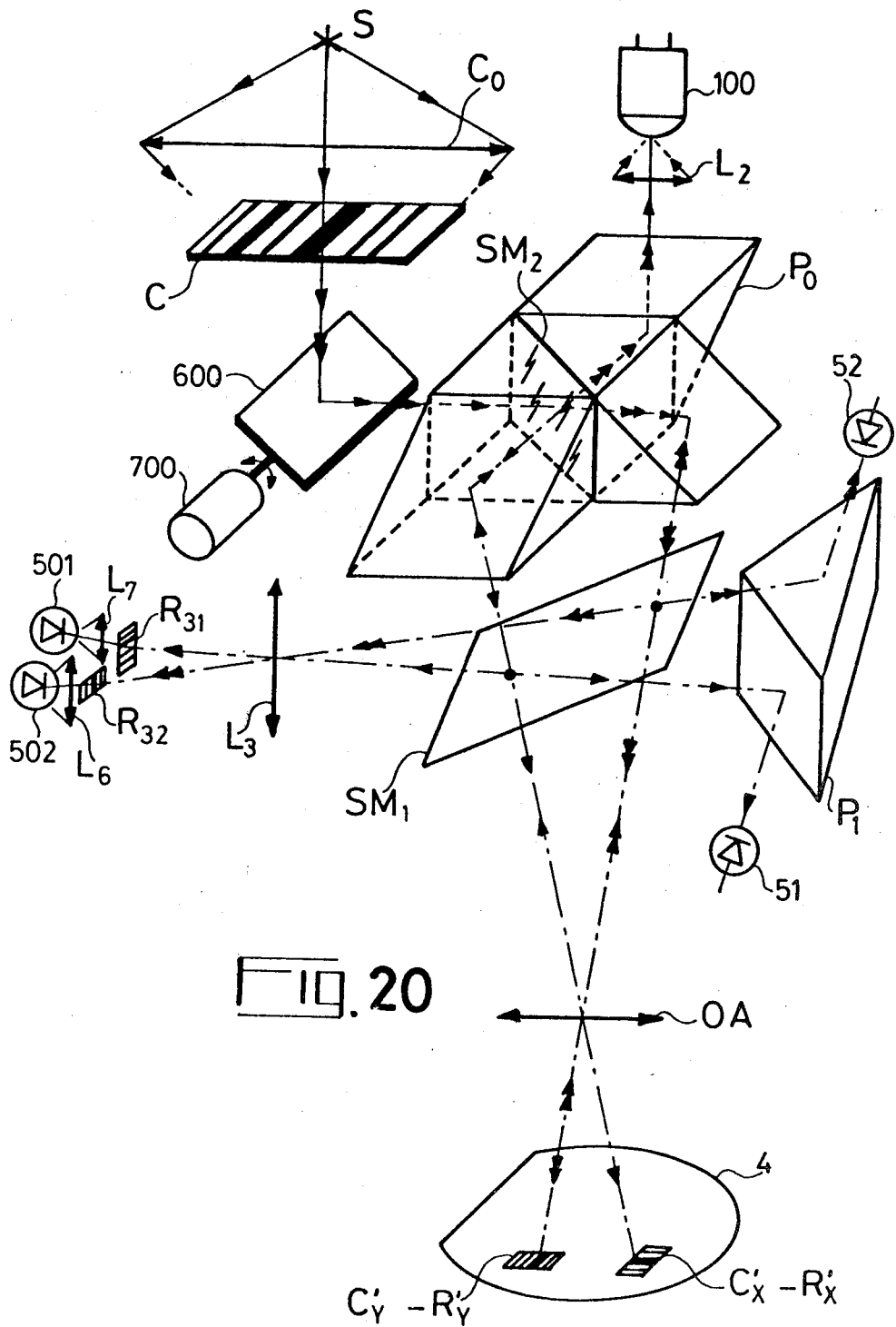
FIG. 20 shows a particular embodiment of an optical alignment system of the invention using an auxiliary alignment lens (X-Y).

FIG. 20 shows another embodiment of the second approach, i.e. with use of additional marks and separation of the alignment and projection paths. According to this variation, the XY alignment is achieved by means of an auxiliary lens OA. Furthermore, the image of code C, illuminated by source S through condenser CO is split into two by an assembly of prisms $P_0$, also forming a semi-transparent mirror $SM_2$. The light rays thus split up are reflected by a second semi-transparent mirror $SM_1$ and are projected by lens $L_3$ onto machine marks $R_{31}$ and $R_{32}$. Two opto-electronic units, respectively $L_6$-502 and $L_7$-501, are used for aligning the split images of C in relation to these machine marks. The superimposition of the split images of C on marks $R_{31}$ and $R_{32}$ is provided by means of a mirror 600, driven by a scanning unit 700. This unit imparts to mirror 600 alternate pivoting of constant amplitude and a given frequency. Thus, when the images of C coincide on $R_{31}$ and $R_{32}$, an angle $\alpha_0$ of mirror 600 is determined which serves as initial reference. The split images are also projected through the semi-transparent mirror $S_{M1}$ and by means of lens OA onto two marks etched on the silicon wafer 4 respectively $C'_X-R'_X$, $c'_Y-R'_Y$. These two marks illuminated by the split images of C will produce orders of interference in the Fourier plane, as was previously outlined. These orders will be detected by opto-electronic means 51 and 52 after reflection at semi-transparent mirror $SM_1$ in directions $R'_X$, $R'_Y$ and the two reflecting faces of a prism $P_1$. Furthermore, the image of C'$_X$ and C'$_Y$ illuminated by the split image of C, is taken by the assembly of prisms P$_0$ for visualizing on a vidicon tube 100, preceded by a converging lens L$_2$.

In all that has gone before, discrimination between alignment axes X and Y has been obtained by a spatial type discrimination. Other variations may be used and are applicable to all the embodiments which have been described.

According to a first variation, in a first phase the marks required for alignment along axis X are illuminated and this alignment carried out. In a second phase, the marks required for alignment along an axis Y are then illuminated and the corresponding alignment carried out. For this, two shutters may be used (exclusive one of the other), illuminating in turn the alignment path X and the alignment path Y.

Figure 21:
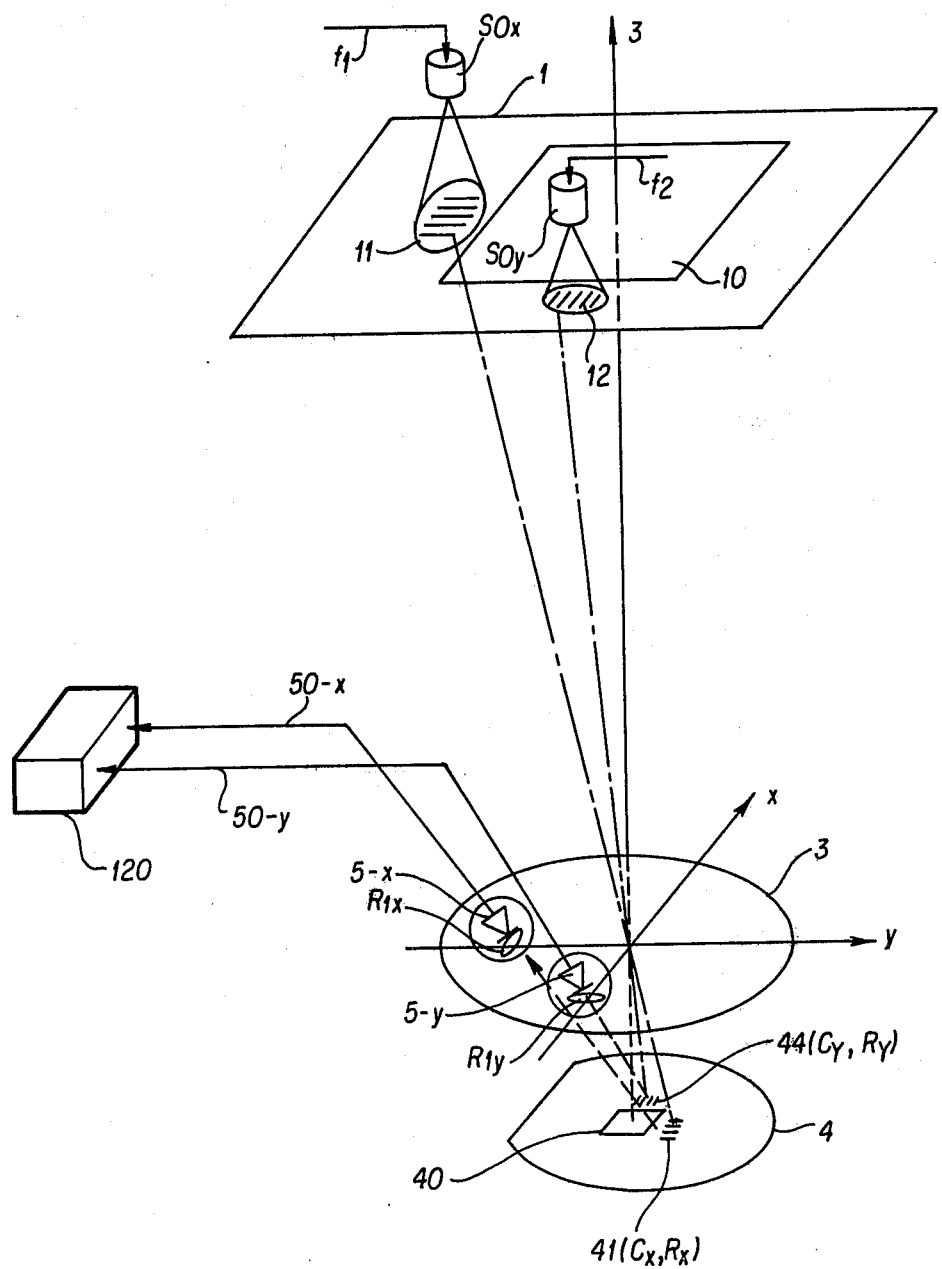
FIG. 21 illustrates a variation of the embodiments which includes the modulation of the laser source by two different frequencies.

In a second variation, as illustrated in FIG. 21, the laser illumination source is modulated by two different frequencies, for example f1=1 MHz, f2=300 KHz. A suitable electronic means may discriminate these two frequencies which correspond to the two alignment paths X and Y. A first detecting means (5-x, R$_{1x}$, 50-x) is associated with the alignment path X and a second detecting means (5-y, R$_{1y}$, 50-y) is associated with the alignment path Y. An electronic means 120 discriminates between these two frequencies.

Figure 22:
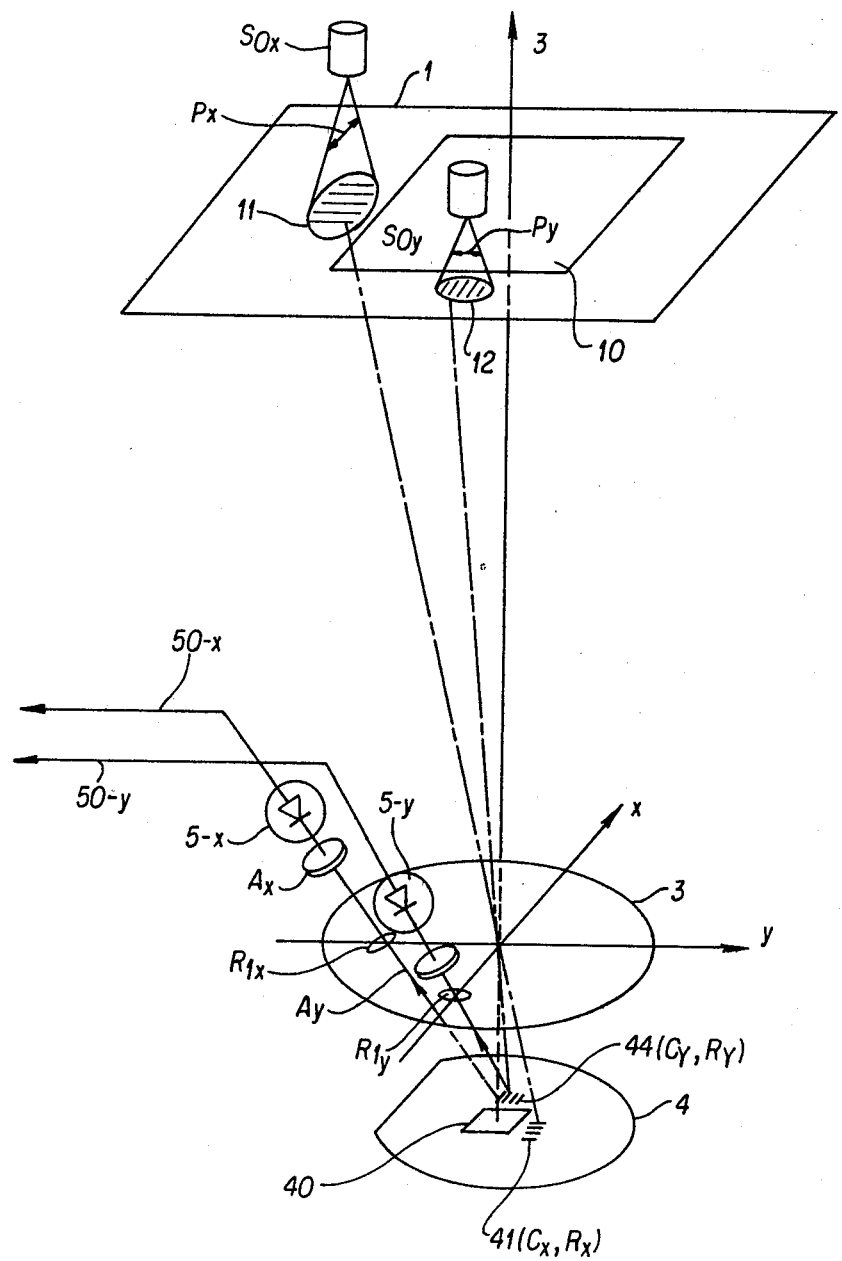
FIG. 22 details a variant of the embodiments which employs two differently polarized beams.

In a third variation, as illustrated in FIG. 22, two differently polarized beams may be used: the first Source S$_{ox}$ supplies a polarized beam according to P$_x$ for illuminating the marks required for alignment of path X, the second source S$_{oy}$ illuminates the marks required for alignment of path Y according to P$_y$. By way of non-limiting example, the first beam has a linear polarization parallel to direction C$_X$, detectors 5-x and 5-y are fitted with analyzers A$_x$ and A$_y$ respectively.

In the three preceding variations, optical fibers may be used for illuminating the marks corresponding to paths X and Y, by means of light beams previously suitably conditioned.

The invention is not limited to the embodiments which have just been described. In particular the alignment system of the invention may be applied to other devices than a photo-repeater. The alignment system of the invention may be applied to any device used for aligning one or more objects on which are provided at least one alignment pattern, in relation to a reference pattern provided on a fixed medium. The alignment is achieved by detection, in a privileged direction, of orders of diffraction obtained by projection of the image of the reference patterns on the alignment pattern(s) provided on the objects to be aligned.

It is apparent that within the scope of the invention, modifications and different arrangements can be made other than are here disclosed. The present disclosure is merely illustrative with the invention comprehending all variations thereof.

What is claimed is:

1. An optical system for aligning along a plurality of aligning axis at least a first pattern, carried by a first mobile medium, in relation to a second pattern, carried by a second medium, forming a first fixed reference, said system comprising for each alignment axis:

first and second patterns each comprising at least one principal optical network formed by a series of parallel strokes whose width and spatial distribution in a first direction are parallel to its respective alignment axis and are determined by a particular distribution code where the strokes of the first pattern are interrupted periodically in a second direction to form an optical network having a constant pitch in said second direction;

a monochromatic source of light energy combined with optical means for illuminating said first pattern by projection on said first pattern of the image of said second pattern with a predetermined magnification and for producing orders of diffraction in said first and second direction; and means for detecting the intensity of a predetermined part of non-zero order patterns of said orders of diffraction in the second direction, said detected intensity passing through a maximum with accurate alignment being obtained when the spatial correlation of said first pattern and of the projection of the image of said second pattern on said first pattern is a maximum.

2. The system as claimed in claim 1, wherein said second medium is a transparent material on which is inscribed said second pattern comprising at least one principal optical network formed by strokes defining alternate zones differentiated by their coefficients of transmission; and wherein said first medium is a reflecting material on which is etched the second pattern comprising at least one principal optical network formed by strokes defining alternate zones differentiated by their coefficients of reflection.

3. The system as claimed in claim 2, wherein said particular distribution code is such that said alternate zones differentiated by their coefficients of transmission of said second pattern, and said alternate zones differentiated by their coefficients of reflection of said first pattern are distributed non-uniformly.

4. The system as claimed in claim 3, wherein further said principal optical network of said first pattern is formed by two identical imbricated networks having a constant pitch in said second direction and staggered in relation to each other along said first direction to create a composite optical network having two discrete values of constant pitch in said second direction, so as to produce two series of orders of diffractions, spatially separate; alignment being obtained when the detected intensity of a predetermined part of one of said two series of orders of diffraction in said second direction is maximum.

5. The system as claimed in claim 2, wherein said particular distribution code is such that said alternate zones differentiated by their coefficients of transmission of said second pattern, and said alternate zones differentiated by their coefficients of reflection of said first pattern, define a principal optical network with constant pitch in said first direction and wherein there is provided on each side of said principal optical network of said first pattern, in said first direction, a first lateral optical network and a second lateral optical network, both having a constant pitch in the second direction; the pitches of said first and second lateral optical networks being different from each other and different from the constant pitch of said principal network, so as to create in said second direction orders of diffraction distinct from those of said principal network.

6. The system as claimed in claim 5, wherein second additional means are provided for detecting the intensity of a predetermined part of the orders of diffraction of said lateral networks, for effecting an approach before the accurate alignment.

7. The system as claimed in claim 1, wherein said optical means comprise at least one converging lens, concentrating the light energy from the monochromatic source of light energy onto said second pattern and a projection lens combining optically said second pattern and said first pattern; and wherein the diffracted rays resulting from said projection return through said projection lens to be detected in the image of the Fourier plane.

8. The system as claimed in claim 1, wherein said first and second patterns are each formed by two optical networks and wherein said first direction of said first network is parallel to a first coordinate axis and said first direction of said second network is parallel to a second axis, perpendicular to said first coordinate axis, so that the alignment of said first pattern may be carried out along two orthogonal coordinate axes.

9. The system as claimed in claim 8, wherein the alignment along said two coordinate axes is achieved by detecting a predetermined part of the orders of diffraction in said second direction of said first and second optical networks.

10. The system as claimed in claim 8, wherein said first and second optical networks of said first pattern are illuminated sequentially and wherein the alignment along said two coordinate axes is achieved by detecting in synchronism with the illumination of said first and second optical networks, a predetermined part of the orders of diffraction along said second direction of said first and second optical networks.

11. The system as claimed in claim 8, wherein said first and second optical networks of the first pattern are illuminated simultaneously by first and second light beams, modulated respectively at a first frequency and at a second frequency; and wherein the alignment along said two coordinate axes is provided by demodulating the output signals of said means for detecting the intensity of a predetermined part of the orders of diffraction along said second direction of said first and second optical networks.

12. The system as claimed in claim 8, wherein said first and second optical networks of said first pattern are illuminated simultaneously by first and second light beams, distinguishable by their polarization; and wherein polarization analyzers are placed in front of said detection means.

13. The system as claimed in claim 1, wherein with the first pattern formed by two identical optical networks in which said first direction of the first network is parallel to a first coordinate axis and the first direction of the second network is parallel to a second coordinate axis perpendicular to the first coordinate axis, and with the second pattern formed by a single optical network, said optical means comprise an assembly of prisms for splitting the image of said single optical network into two secondary images and wherein said two secondary images are projected onto said first and second optical networks of said first pattern so that the alignment on said first pattern in relation to the second pattern may take place along two orthogonal coordinate axes.

14. The system as claimed in claim 8, comprising furthermore electronic means for processing the output signals of said means for detecting the intensity of a predetermined part of the orders of diffraction along said second direction of said first and second optical networks, and means for controlling the movement, along said coordinate axes, of said first medium so as to provide automatic alignment along these two said axes, by feedback to said control means.

15. A photo-repeater comprising an optical alignment system as claimed in claim 1 for aligning a semiconductor wafer having on its upper face a layer of photosensitive resin and on which is inscribed said first pattern, in relation to a grating on which is inscribed said second pattern, as well as other patterns to be projected onto said wafer; wherein there is provided a projection lens used alternately for projecting the image of said second pattern onto said first pattern during alignment phases and for projecting onto said wafer at predetermined positions the image of other patterns during exposure phases.

16. The photo-repeater as claimed in claim 15, comprising further an auxiliary lens for angularly positioning said semiconductor wafer by alignment of an optical network of said first pattern in relation to a third pattern, carried by a third medium.

17. The photo-repeater as claimed in claim 15, comprising a first source of light energy having a first wavelength, activated during said exposure phases, and a second source of light energy having a second wavelength, activated during the alignment phases; wherein, said lens being corrected for said first wave, optical focusing trimming means are provided compensating for the error in focusing and magnification due to the use of radiations of different wavelengths.

18. The photo-repeater comprising an optical alignment system as claimed in claim 1 for aligning said first pattern, etched on a semiconductor wafer having on its upper face a photosensitive layer, in relation to said second pattern forming a first fixed reference; wherein a third pattern is further provided forming a second fixed reference for the initial alignment of said second pattern in relation to said third pattern and optical means are provided comprising a pivotable mirror for carrying out this initial alignment.

19. The photo-repeater as claimed in claims 15 or 18, wherein a device is provided for visualizing said first pattern and the image of said second pattern projected onto said first pattern; the visualization being simultaneous with the detection of the intensity of the predetermined part of the orders of diffraction in said second direction of said first and second optical networks.

20. The photo-repeater as claimed in claim 19, in which the visualization device comprises a television camera.

* * * * *